United States Patent
Liu et al.

(10) Patent No.: US 12,557,703 B2
(45) Date of Patent: Feb. 17, 2026

(54) ILLUMINATOR, ILLUMINATOR REPAIRING DEVICE, AND ILLUMINATOR REPAIRING METHOD

(71) Applicant: Century Technology (Shenzhen) Corporation Limited, Shenzhen (CN)

(72) Inventors: Kuang-Hua Liu, Shenzhen (CN); Ming-Yi Hsieh, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 107 days.

(21) Appl. No.: 18/135,032

(22) Filed: Apr. 14, 2023

(65) Prior Publication Data

US 2023/0352456 A1    Nov. 2, 2023

(30) Foreign Application Priority Data

Apr. 29, 2022  (CN) .......................... 202210473747.3

(51) Int. Cl.
*H01L 25/075*  (2006.01)
(52) U.S. Cl.
CPC .............................. *H01L 25/0753* (2013.01)
(58) Field of Classification Search
CPC ........................... H01L 25/0753; H01L 33/62
See application file for complete search history.

(56) References Cited

U.S. PATENT DOCUMENTS

| 11,641,010 B2 | 5/2023 | Hsieh et al. |
| 2014/0008691 A1* | 1/2014 | Tomoda ................ H10F 77/933 257/435 |
| 2020/0303611 A1* | 9/2020 | Sounart ............... H01L 25/0753 |

FOREIGN PATENT DOCUMENTS

WO          2019128118 A1     7/2019

* cited by examiner

*Primary Examiner* — Abdulmajeed Aziz
*Assistant Examiner* — Jessica M Apenteng
(74) *Attorney, Agent, or Firm* — ScienBiziP, P.C.

(57) ABSTRACT

An illuminator comprises a substrate, a plurality of connecting pads, a plurality of LEDs, and a plurality of adhesive blocks. The plurality of connecting pads is on the substrate, each of the connecting pads defines a first well. Each of the plurality of LEDs is on one of the plurality of connecting pads. Each of the plurality of adhesive blocks bonds one of the plurality of LEDs and one of the plurality of connecting pads. Each of the plurality of adhesive blocks at least partially covers the first well of the corresponding one of the plurality of connecting pads, enabling light to shine on the each of plurality of adhesive blocks from a side of the substrate away from the plurality of connecting pads. An illuminator repairing device and an illuminator repairing method are also disclosed.

20 Claims, 5 Drawing Sheets

ILLUMINATOR, ILLUMINATOR REPAIRING DEVICE, AND ILLUMINATOR REPAIRING METHOD

FIELD

The subject matter herein generally relates to displays, specifically to an illuminator, an illuminator repairing device, and an illuminator repairing method.

BACKGROUND

Existing illuminator repairing methods usually use laser to irradiate a damaged light emitting diode (LED) directly, so that the LED can be removed after destroying the adhesive material used to bond the LED. However, because the LED is between the laser and the adhesive material, the LED will adsorb a lot of heat in the process of destroying the adhesive material, such a method not only result in high energy consumption, but may also causes damages to the illuminator. Moreover, in order to prevent the high energy laser from affecting the adjacent LEDs, the illuminators usually set a large distance between two adjacent LEDs, which limits the resolution of the illuminators.

BRIEF DESCRIPTION OF THE DRAWINGS

Implementations of the present technology will now be described, by way of example only, with reference to the attached figures, wherein.

DETAILED DESCRIPTION

Figure 1:
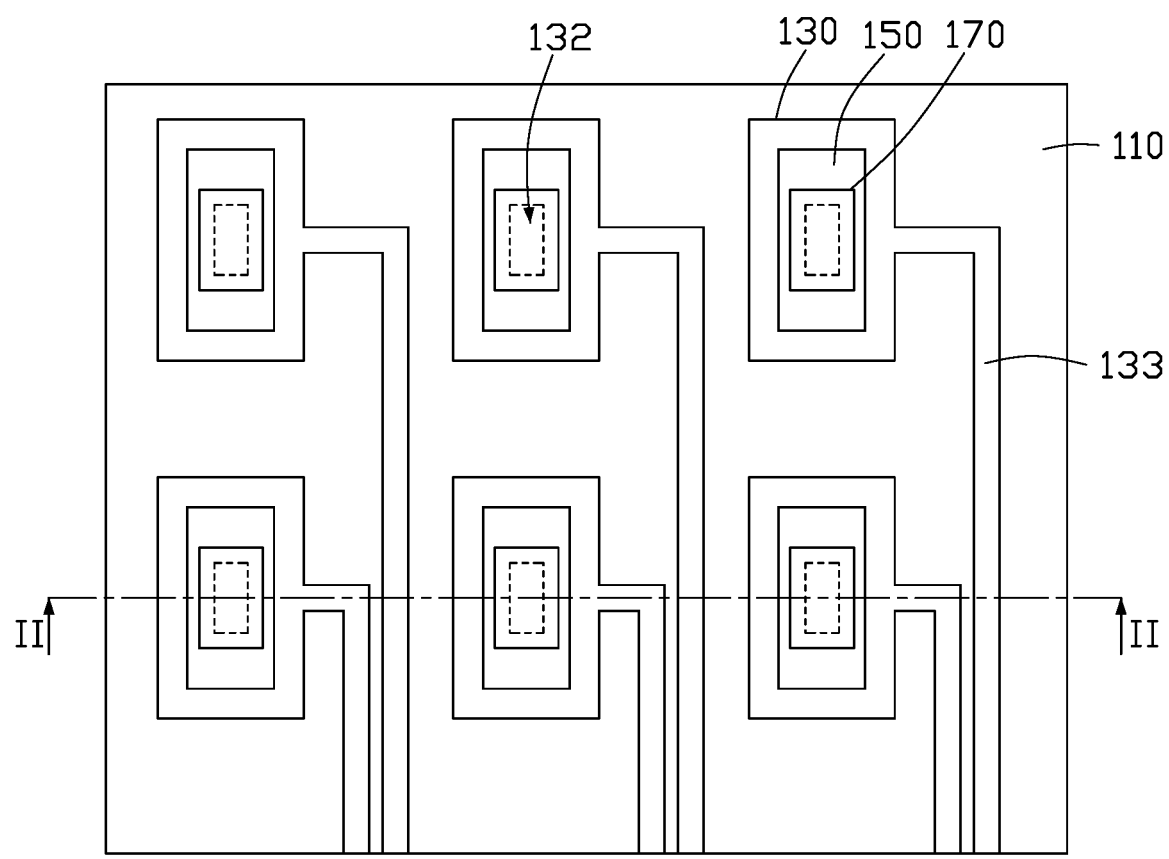
FIG. 1 is a top view of an illuminator according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

"Optional" or "optionally" means that the subsequently described circumstance may or may not occur, so that the description includes instances where the circumstance occurs and instances where it does not.

When a feature or element is herein referred to as being "on" another feature or element, it can be directly on the other feature or element or intervening features and/or elements may also be present. It will also be understood that, when a feature or element is referred to as being "connected", "attached" or "coupled" to another feature or element, it can be directly connected, attached or coupled to the other feature or element or intervening features or elements may be present.

Figure 2:
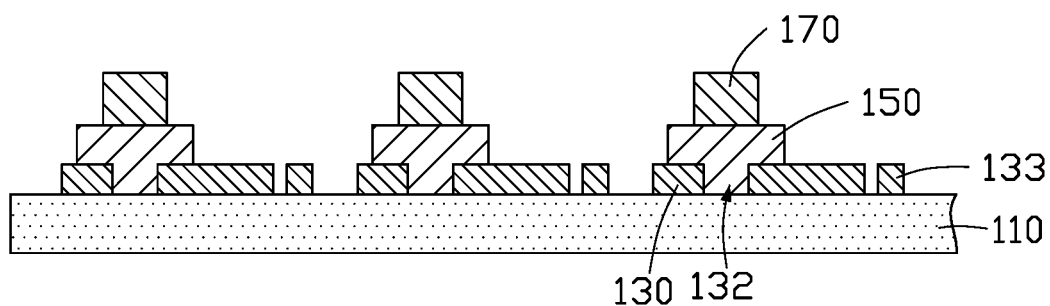
FIG. 2 is a cross sectional view of FIG. 1 taken along line II-II.

FIG. 1 and FIG. 2 illustrate a top view and a cross-sectional view of an illuminator 100 according to a first embodiment of the present disclosure, respectively. The illuminator 100 includes a substrate 110, a plurality of connecting pads 130, a plurality of LEDs 170, and a plurality of adhesive blocks 150. The plurality of connecting pads 130 is arranged as an array and mounted on the substrate 110. Each connecting pad 130 defines a first well 132. Each LED 170 is attached to a connecting pad 130. Each adhesive blocks 150 is between a connecting pad 130 and a LED 190 to bond the LED 170 on the connecting pad 130. The adhesive blocks 150 at least covers the first well 132, so that a light can shine on the adhesive block 132 from a side of the substrate 110 away from the connecting pads 130.

In this embodiment, the substrate 110 includes a plurality of wires 133, each wire 133 is electrical connected to a connecting pad 130 to transmit an electrical signal to a LED 170. Specifically, the LED 170 is a vertical LED, including a first electrode near the substrate 110 and a second electrode away from the substrate 110 (not shown in the figure). The first electrode electrical connects to the connecting pad 130 through the adhesive block 150 for electrical connects to the wire 133. The wire 133 is used to transmit the electrical signal to the LED 170, thus providing a voltage to the first electrode. When a voltage difference is formed between the first electrode and the second electrode of the LED 170, the LED 170 will emit a light in response to the voltage difference.

In another embodiment, the LED 170 can also be a front-mounted LED or a flip chip LED. Specifically, when the LED 170 is a front-mounted LED, both electrode (a first electrode and a second electrode) of the LED 170 is on a side away from the substrate 110. At this time, the substrate 110 does not include wire 133, and the illuminator 100 further includes a wire layer on the plurality of LEDs 170 away from the substrate 110. The wire layer is used to power the LEDs 170. When the LED 170 is a flip chip LED, both electrode (a first electrode and a second electrode) of the LED 170 is on a side near the substrate 110. At this time, each electrodes of the LED 170 connects to a connecting pad 130 to power the LED 170.

In this embodiment, each LED 170 is a mini LED or a micro LED (about 1 μm-200 μm in size). The illuminator 100 bonded with a plurality of LEDs 170 can be used as a backlight module of a liquid crystal display device to provide a light source. In another embodiment, the illuminator 100 is a self-luminous display device. In other embodiments, the illuminator 100 is a lighting device such as a stage light. This disclosure does not limit the application of the illuminator 100.

In this embodiment, the material of adhesive block 150 may be silver glue, tin paste, epoxy resin, indium tin oxide, or allotropic conductive adhesive. When the adhesive block 150 is shined by a laser, the heat absorbed by the adhesive block 150 will increases gradually with the energy of the laser from low to high. When the temperature of the adhesive block 150 reaches a certain temperature, the adhesive block 150 begins to melt, and when the temperature rises further, the adhesive block 150 will begin to vaporize. A melting point of the adhesive block 150 is lower than each of a melting point of the connecting pads 130 and a melting point of the substrate 110.

In this embodiment, a material of the connecting pads 130 can be metal, and the first well 132 is defined on the connecting pad 130, so that the part of the substrate 110 corresponding to the first well 132 is exposed relative to the connecting pad 130. The adhesive block 150 is filled in the first well 132 and is in contact with the substrate 110. In another embodiment, the adhesive block 150 can also cover but not fill the first well 132, or partially cover and fill the first well 132.

The first well 132 may be defined on any position of the connecting pad 130 which can be partially covered by the adhesive block 150. In this embodiment, a geometric center projected by the adhesive block 150 on the substrate 110 coincides with the geometric center projected by the first well 132 on the substrate 110, so that when the laser is shined on the adhesive block 150, the heat can be diffused from the center to the periphery, so that the adhesive block 150 can melt at an uniform rate.

In this embodiment, the substrate 110 is a transparent substrate. Specifically, the material of the substrate 110 can be light transparent material, such as glass, etc. The light can pass through the substrate 110 from a side of the substrate 110 away from the connecting pads 130, and shine on the adhesive block 150 covering the first well 132.

Figure 3:
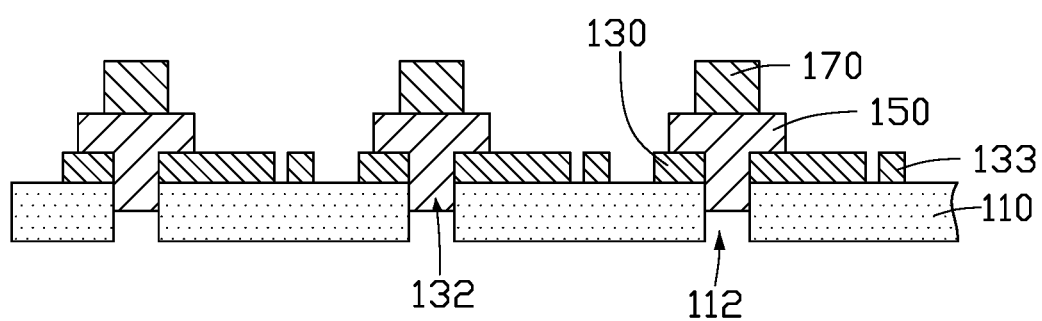
FIG. 3 is a cross sectional view of an illuminator according to another embodiment of the present disclosure.

FIG. 3 illustrates a cross-sectional view of an illuminator according to a second embodiment of the present disclosure. Unlike the first embodiment, in this embodiment, the substrate 110 defines a plurality of second wells 112, each second wells 112 is communicated with a first well 132. Specifically, the substrate 110 is an opaque material, such as a printed circuit board or polyimide. By defining the second wells 112 on the substrate 110 to communicate the first wells 132, a light can shine on the adhesive block 150 through the first well 132 and the second well 112 from a side of the substrate 110 away from the connecting pads 130. As an example, each second well 112 is concentric with one first well 132.

In a comparison current embodiment, a laser shines at the adhesive block from a side of the substate near the LED to remove the detached LED after the adhesive block has melted.

Firstly, a laser irradiation mode makes the laser pass through the LED and then reach the adhesive block, and the heat generated by the laser is absorbed by the LED. As a result, the laser energy needs to be increased so that after the laser is absorbed by the LED, the energy is still enough to melt the adhesive block.

Secondly, after increasing the laser energy, the high temperature generated by the laser is easy to damage the illuminator.

Thirdly, in order to reduce the high temperature damage to the illuminator, in this comparison embodiment, sufficient space is reserved around each connecting pad to avoid the damage caused by high temperature affecting the LED on the surrounding connecting pad. As a result, the spacing between the LEDs on the connecting pad also expands. When the illuminator is used as an image display device, the image resolution will be reduced.

But the illuminator 100 in the embodiments of the present disclosure, by defining the first well 132 on the connecting pad 130, and enabling the laser shine on the adhesive block 150 covering the first well 132 on a side of the substrate 110 away from the connecting pads 130. As a result, the adhesive block 150 can be shined from a side of the substrate 110 away from the connecting pads 130 and be melted to release the LED 170 from the connecting pad 130. Compared with the process of shining the adhesive block 150 from a side of the substrate 110 near the connecting pad 130, the process in the embodiments of the present disclosure can avoid the heat being absorbed by the LED 170. Therefore, it is beneficial to reduce energy consumption, and avoid the damage of the illuminator 100 caused by high temperature, and thus to avoid the buffer space reserved around the connecting pad 130, to shorten the spacing between two adjacent LED 170. When the illuminator 100 is applied to a display device, the shortened space between the LEDs 170 can improve the image resolution.

Figure 4:
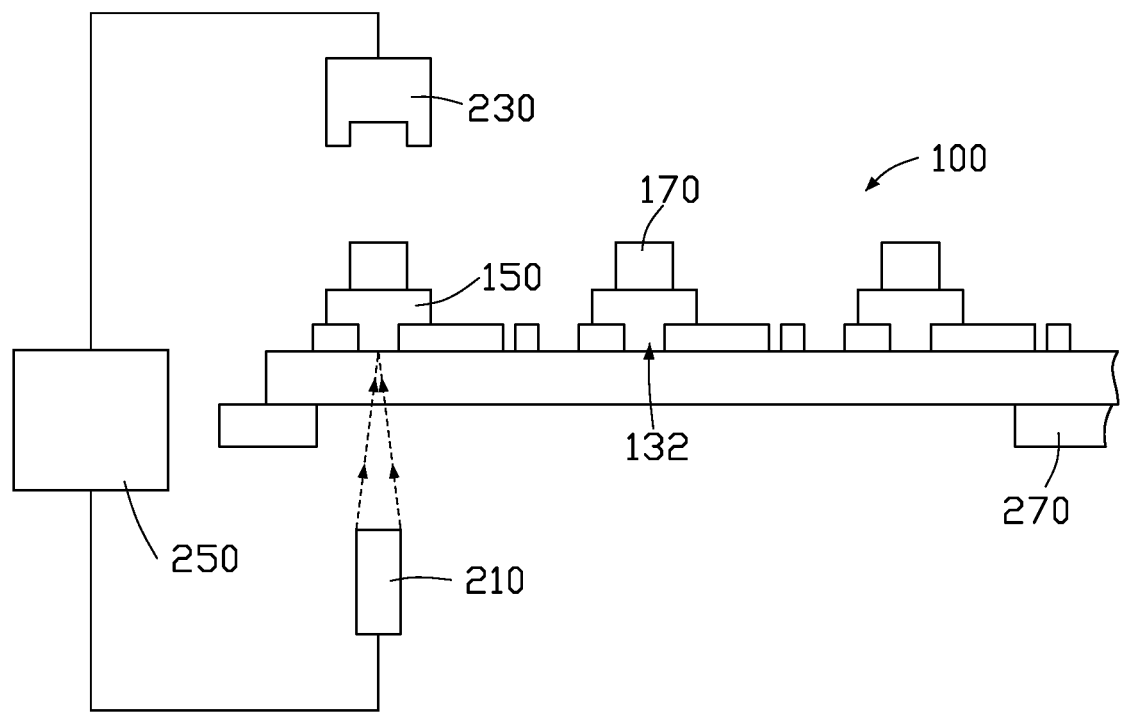
FIG. 4 is a cross sectional view of an illuminator repairing device according to an embodiment of the present disclosure.

FIG. 4 illustrates a cross-sectional view of an illuminator repairing device according to a third embodiment of the present disclosure. The illuminator repairing device 200 is used to repair the illuminator 100. Since the size of the LEDs 170 assembled on the illuminator 100 is small (about 1 μm-200 μm in size), a large number of LEDs 170 are transferred on the substrate 110 in batches by mass transfer technology. In the mass transfer process, some LEDs 170 may fail, for example, some LEDs 170 have quality problems, or some LEDs 170 are transferred to a wrong position during the mass transfer process, resulting in poor contact. Therefore, after the assembly of the illuminator 100, there is a process to check whether the LEDs 170 will emit light normally, and the LEDs 170 cannot emit light normally will be repaired. The repairing of the illuminator 100 is usually to remove or destroy the LEDs 170 cannot emit light normally, and bond new LEDs 170 on the connecting pads 130.

In this embodiment, the illuminator repairing device 200 includes: a laser 210, a repairing module 230, a positioning module 250 and a supporting platform 270. The laser 210 is located on a side of the substrate 110 away from the connecting pads 130, and is used to shine and melt the adhesive block 150 from the side of the substrate 110 away from the connecting pads 130, and to release the LED 170 from the connecting pad 130. The repairing module 230 is located on a side of the LEDs 170 away from the substrate 110, and is used to remove the released LED 170 from the connecting pad 130. The positioning module 250 is connected to the laser 210 and the repairing module 230 respectively, to control the alignment of the laser 210 and the repairing module 230 with the connecting pad 130 from both sides of the substrate 110. The supporting platform 270 is used to fix the illuminator 100 between the laser 210 and the repairing module 230, and to keep both sides of the substrate 110 with connecting pads 130 unblocked.

In this embodiment, the laser 210 may be a carbon dioxide laser or a fiber laser used to emit a high energy laser. When the laser shines on the adhesive block 150 through the substrate 110, the adhesive block 150 will absorb the laser energy and convert the laser energy to heat, thereby increasing the temperature until melting.

In this embodiment, the repairing module 230 can be a grasping head used to catch the LED 170 directly, or a sucker used to suck the LED 170 by vacuum adsorption, or a probe with adhesive to bond the LED 170 by adhesion. The present disclosure does not limit the structure of the repairing module 230, all structures that can pick the LED 170 can be used as the repairing module 230.

In this embodiment, in addition to removing the LED 170 from the connecting pad 130, the repairing module 230 can also transfer a new LED 170 to the connecting pad 130. Specifically, in some cases, after removing the LED 170 from the connecting pad 130, the corresponding spot of the connecting pad 130 can be a dark spot that does not emit light. In other, after removing the LED 170 from the connecting pad 130, a new LED 170 is bonded onto the connecting pad 130, to make the corresponding spot emit light normally.

In this embodiment, the positioning module 250 includes a control device used to control the movement of the laser 210 and the repairing module 230, such as mechanical arm or transmission mechanism, etc. After identifying the LED 170 to be repaired, the positioning module 250 will control the laser 210 and the repairing module 230 to move towards the LED 170 from both sides of the substrate 110, until the laser 210 and the repairing module 230 are aligned with the LED 170 in a direction perpendicular to the substrate 110. The laser 210 needs to be aligned with the first well 132, so that the adhesive block 150 covering the first well 132 can be melted. In other embodiments, the positions of the laser 210 and the repairing module 230 can be fixed, and the illuminator 100 can be moved to make the laser 210 and the repairing module 230 are aligned with the connecting pad 130 at the same time.

Figure 5:
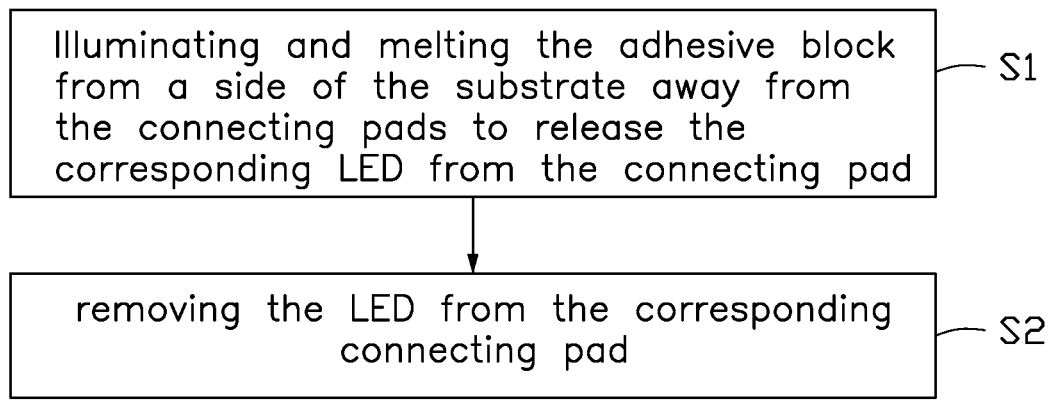
FIG. 5 is a flow chart of an illuminator repairing method according to an embodiment of the present disclosure.

Referring to FIG. 5, a flowchart of an illuminator repairing method is presented in accordance with an example embodiment which is being thus illustrated. The method is provided by way of example, as there are a variety of ways to carry out the method. The method described below can be carried out using the configurations illustrated in FIGS. 1 through 4, for example, and various elements of these figures are referenced in explaining example method. Each block shown in FIG. 5 represents one or more processes, methods or subroutines, carried out in the exemplary method. Additionally, the illustrated order of blocks is by example only and the order of the blocks can change according to the present disclosure. The exemplary method can begin at block S1.

At block S1, any adhesive block bonded with a light emitting diode (LED) out of work is melt by irradiating laser light from a side of the substrate away from the plurality of connecting pads to release the corresponding LED from the corresponding connecting pad;

At block S2, the LED released is removed from the corresponding connecting pad.

In this embodiment, before illuminating and melting any of the adhesive blocks 150, the illuminator repairing method further includes: locating the position of the LED 170 needs to be released, and aligning the laser 210 and the repairing module 230 with the adhesive block 150 corresponding LED 170. Specifically, after determining a certain LED 170 needs to be released, the position of the LED 170 needs to be found, and then driving the laser 210 from a side of the substrate 110 away from the connecting pad 130 to align with the first well 132 corresponding to the LED 170. So that the laser emitted by the laser 210 can be focused on the adhesive block 150 corresponding to the LED 170.

In this embodiment, the block S2 further includes: catching the LED 170 by using the repairing module 230, and removing the LED 170 from the connecting pad 130.

In this embodiment, the block S1 and the block S2 can be performed at the same time. Specifically, since the laser 210 is on a side of the substrate 110 away from the connecting pads 130, the repairing module 230 is on another side of the substrate 110 near the connecting pads 130, the repairing module 230 will not affect the laser 210 shining the adhesive block 150. The repairing module 230 can catch the LED 170 while the laser 210 is shining the adhesive block 150, and the LED 170 can be removed when the adhesive block 150 begins to melt, thus speeding the repairing process.

In this embodiment, after removing the LED 170 released from the corresponding connecting pad 130, the illuminator repairing method further includes: bonding a new LED 170 on the corresponding connecting pad 130. Specifically, after removing the damage LED 170, a new LED 170 can be bonded on the connecting pad 130, to make the spot corresponding to the connecting pad 130 emit light normally.

By setting the laser 210 shining and melting the adhesive block on a side of the substrate 110 away from the connecting pads 130, compared with the existing technology which shining the adhesive block 150 on a side of the substrate 110 near the connecting pads 130, the heat generated by the laser 210 can be avoided being absorbed by the LED 170 first, which is conductive to reducing energy consumption, and to avoiding the damage of illuminator 100 under high temperature. By setting the laser 210 and the repairing module 230 on either sides of the substrate 110, the process of releasing the LED and the process of removing the LED 170 can be performed simultaneously, which increasing the repair efficiency and reducing energy consumption.

Specifically, in the prior art, the laser 210 and the repairing module 230 is on a same side of the substrate 110 near to the connecting pads 130, thus the repairing module 230 has to remove the LED 170 after the laser 210 shining the connecting pad 130. If the laser only provides an energy to melt the adhesive block 150, the adhesive block 150 may resolidify during the switch from the laser 210 to the repairing module 230. As a result, a higher energy is required from the laser 210, or even vaporize the adhesive block 150.

By setting the laser 210 and the repairing module 230 on either sides of the substrate 110, the laser 210 and the repairing module 230 can work at the same time, thus the LED 170 can be removed from the connecting pad 130 at the moment of the adhesive block 150 melts, which not only reduce the energy of the laser 210, but also speed up the repairing process.

The embodiments shown and described above are only examples. Many details are often found in the art such as the other features of an illuminator. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An illuminator comprising:
   a substrate;
   a plurality of connecting pads on the substrate, each of the plurality of connecting pads comprising a first well;
   a plurality of light emitting diodes (LEDs), each of the plurality of LEDs being on a corresponding one of the plurality of connecting pads; and
   a plurality of adhesive blocks, each of the plurality of adhesive blocks bonding a corresponding one of the plurality of LEDs and the corresponding one of the plurality of connecting pads; wherein each of the plurality of adhesive blocks at least partially covers the first well of the corresponding one of the plurality of connecting pads, wherein
   the substrate comprises a plurality of second wells, and each of the plurality of second wells penetrates the substrate and communicates with a corresponding one of the plurality of first wells; a side of the substrate is configured to receive irradiating laser light; in response to the irradiating laser light penetrating though the substrate, each of the plurality of adhesive blocks is molten by the irradiating laser light, and the corresponding LED is released from the corresponding connecting pad.

2. The illuminator of claim 1, wherein the substrate is made of a transparent material.

3. The illuminator of claim 1, wherein the substrate comprises a plurality of wires, and each of the plurality of wires is electrically connected to a corresponding one of the plurality of connecting pads for transmitting an electrical signal to the corresponding LED.

4. The illuminator of claim 1, wherein a melting point of the plurality of adhesive blocks is lower than a melting point of the substrate and a melting point of the plurality of connecting pads.

5. The illuminator of claim 1, wherein each of the plurality of adhesive blocks is made of silver glue, tin paste, epoxy resin, indium tin oxide, or allotropic conductive adhesive.

6. The illuminator of claim 1, wherein each of the plurality of adhesive blocks fills the first well of the corresponding one of the plurality of connecting pads and is in contact with a sidewall of a corresponding one of the plurality of second wells formed in the substrate.

7. An illuminator comprising:
   a substrate;
   a plurality of connecting pads on the substrate, each of the plurality of connecting pads having a first well;
   a plurality of light emitting diodes (LEDs), each of the plurality of LEDs being on a corresponding one of the plurality of connecting pads; and
   a plurality of adhesive blocks, each of the plurality of adhesive blocks bonding a corresponding one of the plurality of LEDs and the corresponding one of the plurality of connecting pads; wherein each of the plurality of adhesive blocks at least partially covers the first well of the corresponding one of the plurality of connecting pads; a side of the substrate is configured to receive irradiating laser light; in response to the irradiating laser light penetrating though the substrate, each of the plurality of adhesive blocks is molten by the irradiating laser light, and the corresponding LED is released from the corresponding connecting pad;
   wherein each of the plurality of LEDs is a vertical LED having a first electrode positioned near the substrate and a second electrode positioned away from the substrate, the substrate comprises a plurality of wires, and each of the plurality of wires is electrically connected to the first electrode of the corresponding LED by a corresponding one of the plurality of connecting pads and a corresponding one of the plurality of adhesive blocks.

8. The illuminator of claim 7, wherein the substrate is made of a transparent material.

9. The illuminator of claim 7, wherein a melting point of the plurality of adhesive blocks is lower than each of a melting point of the substrate and a melting point of the plurality of connecting pads.

10. The illuminator of claim 7, wherein each of the plurality of adhesive blocks is made of silver glue, tin paste, epoxy resin, indium tin oxide, or allotropic conductive adhesive.

11. The illuminator of claim 7, wherein each of the plurality of adhesive blocks fills the first well of the corresponding one of the plurality of connecting pads and is in contact with a surface of the substrate on which the plurality of connecting pads is arranged.

12. The illuminator of claim 7, wherein the substrate further comprises a plurality of second wells, and each of the plurality of second wells penetrates the substrate and communicates with a corresponding one of the plurality of first wells.

13. The illuminator of claim 12, wherein each of the plurality of adhesive blocks fills the first well of the corresponding one of the plurality of connecting pads and is in contact with a sidewall of a corresponding one of the plurality of second wells formed in the substrate.

14. An illuminator comprising:
   a substrate;
   a plurality of connecting pads on the substrate, each of the plurality of connecting pads having a first well;
   a plurality of light emitting diodes (LEDs), wherein each of the plurality of LEDs is on a corresponding one of the plurality of connecting pads; and
   a plurality of adhesive blocks, each of the plurality of adhesive blocks bonding a corresponding one of the plurality of LEDs and the corresponding one of the plurality of connecting pads; wherein each of the plurality of adhesive blocks at least partially covers the first well of the corresponding one of the plurality of connecting pads; a side of the substrate is configured to receive irradiating laser light; in response to the irradiating laser light penetrating though the substrate, each of the plurality of adhesive blocks is molten by the irradiating laser light, and the corresponding LED is released from the corresponding connecting pad;
   wherein each of the plurality of LEDs is a front-mounted LED having a first electrode and a second electrode both positioned away from the substrate, the illuminator further comprises a wire layer on the plurality of LEDs, and the wire layer is electrically coupled to the first electrode and the second electrode of each of the plurality of LEDs.

15. The illuminator of claim 14, wherein the substrate is made of a transparent material.

16. The illuminator of claim 14, wherein a melting point of the plurality of adhesive blocks is lower than each of a melting point of the substrate and a melting point of the plurality of connecting pads.

17. The illuminator of claim 14, wherein each of the plurality of adhesive blocks is made of silver glue, tin paste, epoxy resin, indium tin oxide, or allotropic conductive adhesive.

18. The illuminator of claim 14, wherein each of the plurality of adhesive blocks fills the first well of the corresponding one of the plurality of connecting pads and is in contact with a surface of the substrate on which the plurality of connecting pads is arranged.

19. The illuminator of claim 14, wherein the substrate comprises a plurality of second wells, each of the plurality of second wells penetrates the substrate and communicates with a corresponding one of the plurality of first wells.

20. The illuminator of claim 19, wherein each of the plurality of adhesive blocks fills the first well of the corresponding one of the plurality of connecting pads and is in contact with a sidewall of a corresponding one of the plurality of second wells formed in the substrate.

\* \* \* \* \*